(12) United States Patent
Kikuchi et al.

(10) Patent No.: US 8,236,639 B2
(45) Date of Patent: Aug. 7, 2012

(54) SEMICONDUCTOR DEVICE MANUFACTURING METHOD

(75) Inventors: Hiroaki Kikuchi, Tokyo (JP);
Katsunori Kondo, Tokyo (JP); Shigeru Shinohara, Tokyo (JP); Osamu Takahashi, Tokyo (JP); Tomoaki Yamabayashi, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/071,083

(22) Filed: Mar. 24, 2011

(65) Prior Publication Data

US 2011/0244638 A1    Oct. 6, 2011

(30) Foreign Application Priority Data

Mar. 30, 2010    (JP) .................................. 2010-076646

(51) Int. Cl.
*H01L 21/765*    (2006.01)
*H01L 21/8239*    (2006.01)

(52) U.S. Cl. ........ 438/220; 438/294; 438/414; 438/672; 257/E21.544; 257/E21.576

(58) Field of Classification Search .................. 438/220, 438/294, 414, 672; 257/E21.544, E21.576
See application file for complete search history.

(56) References Cited

U.S. PATENT DOCUMENTS

| | | | |
|---|---|---|---|
| 6,413,840 B1 * | 7/2002 | Tseng et al. .................. | 438/476 |
| 6,809,397 B2 * | 10/2004 | Bae ................................ | 257/529 |
| 7,543,262 B2 * | 6/2009 | Wang et al. .................... | 716/119 |
| 7,791,308 B2 * | 9/2010 | Kitabatake et al. ............ | 318/801 |
| 2003/0227042 A1 * | 12/2003 | Hibi et al. ...................... | 257/296 |
| 2004/0005518 A1 * | 1/2004 | Park et al. ...................... | 430/314 |
| 2004/0173831 A1 * | 9/2004 | Kim et al. ...................... | 257/296 |
| 2008/0017897 A1 * | 1/2008 | Saito et al. ..................... | 257/288 |
| 2009/0087999 A1 * | 4/2009 | Richter et al. ................. | 438/762 |
| 2010/0285668 A1 * | 11/2010 | Richter et al. ................. | 438/703 |
| 2010/0311231 A1 * | 12/2010 | Thei et al. ...................... | 438/587 |
| 2011/0244638 A1 * | 10/2011 | Kikuchi et al. ............... | 438/138 |

FOREIGN PATENT DOCUMENTS

| JP | 2007-207784 | | 8/2007 |
|---|---|---|---|
| KR | 2001004239 A | * | 1/2001 |

* cited by examiner

*Primary Examiner* — George Fourson, III
(74) *Attorney, Agent, or Firm* — IPUSA, PLLC

(57) ABSTRACT

A semiconductor device manufacturing method is a method of forming a semiconductor device that includes a cell part that includes plural transistor cells in each of which a gate of a trench type is formed in a semiconductor layer, and diffused layers are formed on both sides of the gate, and a guard ring part that surrounds the cell part. The semiconductor device manufacturing method includes forming an interlayer dielectric film on a surface of the semiconductor layer in which the gate and the diffused layers are formed; reducing a thickness of the interlayer dielectric film formed in the cell part through etch back; forming a contact part having a shape of a hole or a groove in the interlayer dielectric film at a position above the diffused layer; and forming a metal film on the interlayer dialectic film.

9 Claims, 9 Drawing Sheets

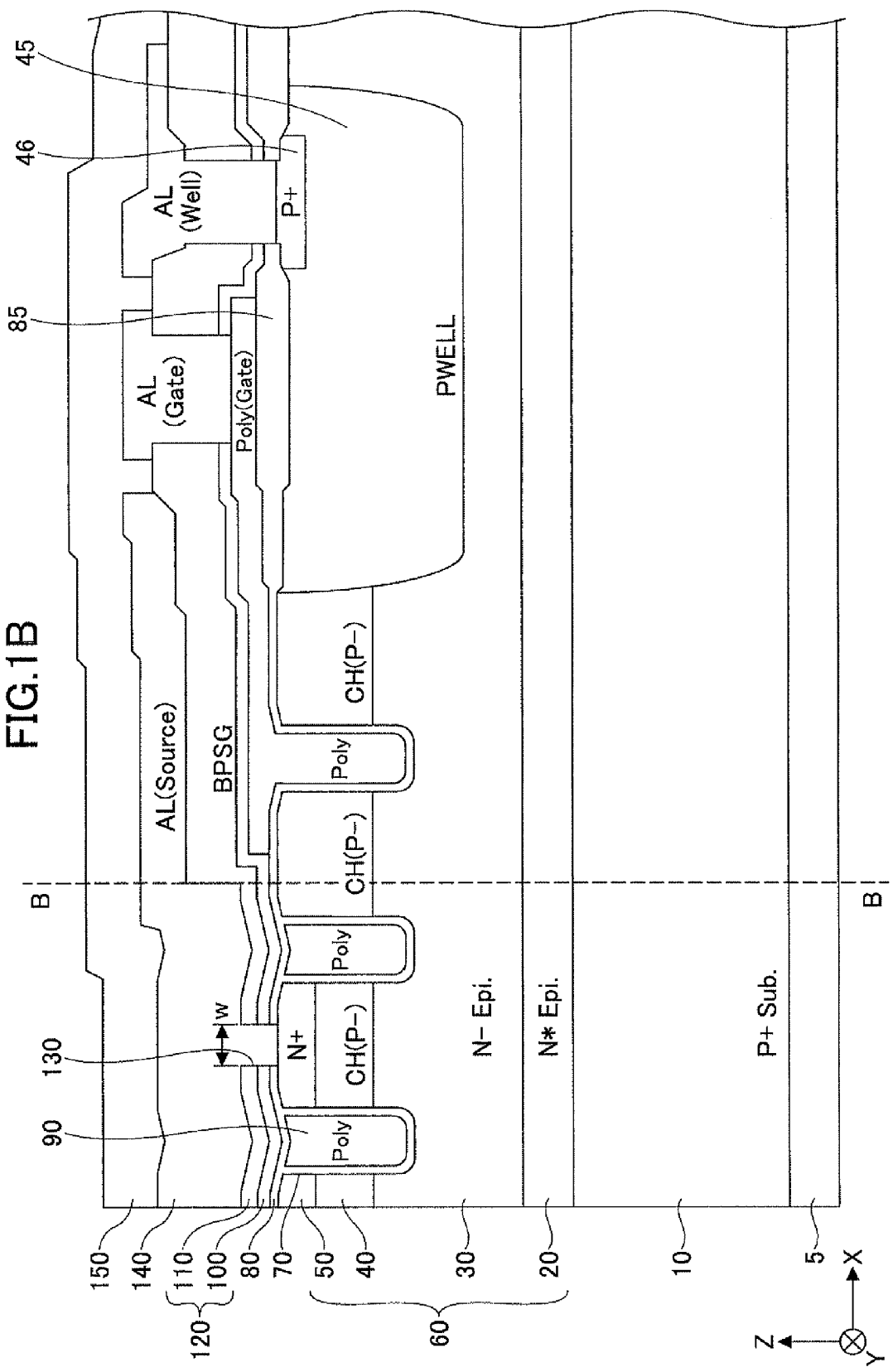

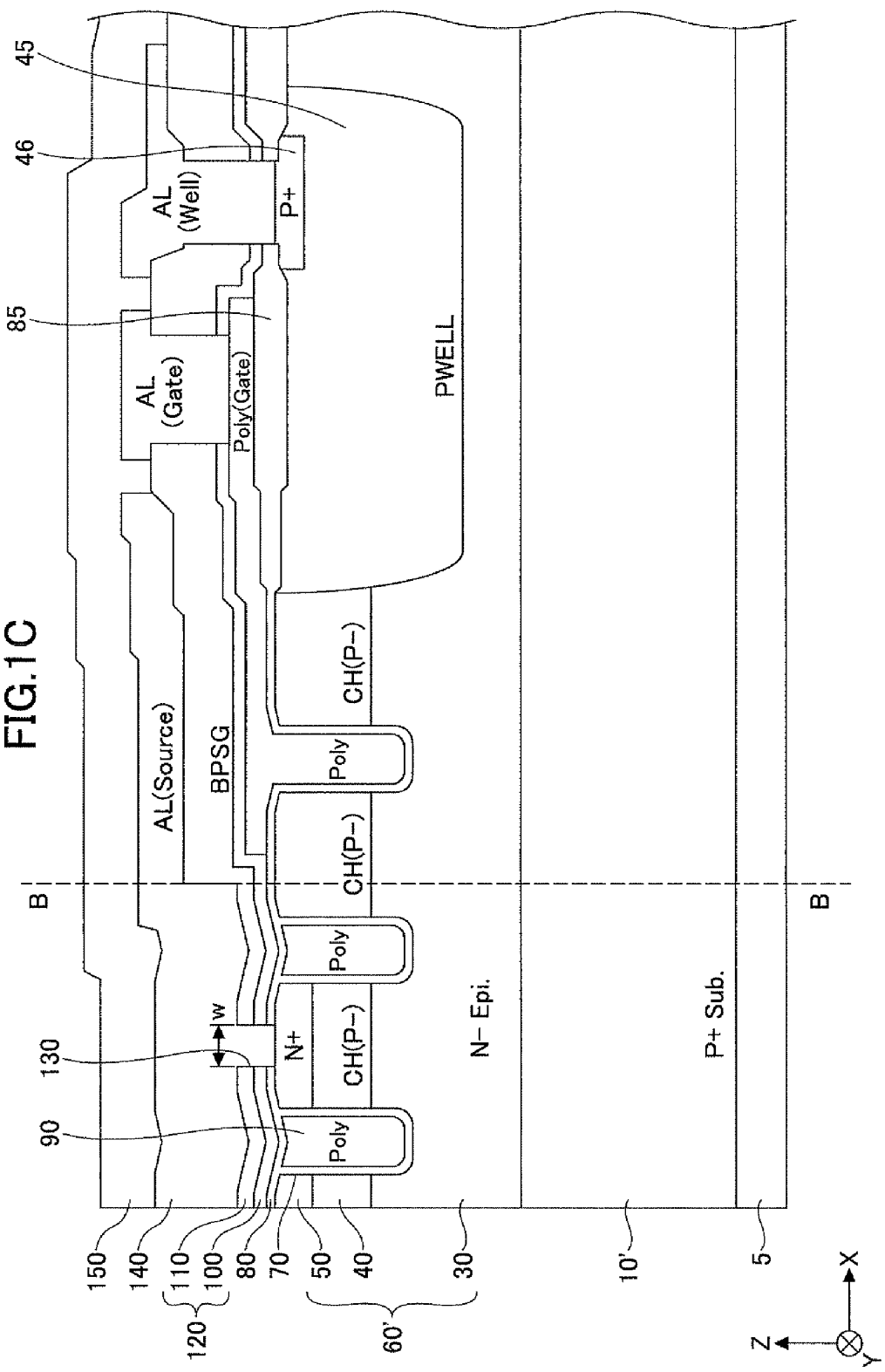

SEMICONDUCTOR DEVICE MANUFACTURING METHOD

BACKGROUND OF THE INVENTION

1. Field of the Invention

The present invention relates to a semiconductor device manufacturing method, and in particular, to a semiconductor device manufacturing method of manufacturing a semiconductor device in which a trench-type gate is formed in a semiconductor layer.

2. Description of the Related Art

A trench-type IGBT (Insulated Gate Bipolar Transistor) is known in which a trench is formed in a semiconductor layer formed on a semiconductor substrate, a gate is formed as a result of a polysilicon film being embedded after an oxide film has been formed in the trench, and diffused layers are formed on both sides of the gate.

FIG. 6 shows a sectional view of one example of the trench-type IGBT. In FIG. 6, on a p-type semiconductor substrate 210, a high-concentration n-type epitaxial layer 220 and a low-concentration n-type epitaxial layer 230 are laminated. On the surface of the low-concentration n-type epitaxial layer 230, a p layer 240 is formed. On a surface of the p layer 240, high-concentration n-type diffused layers 250 are formed. A semiconductor layer 260 includes the high-consternation re-type epitaxial layer 220 through the p layer 240 and the high-concentration n-type diffused layers 250. Further, from a surface of the semiconductor layer 260, a trench 270 is formed, and a surface of the trench 270 is covered by an oxide film 280. On the oxide film 280 in the inside of the trench 270, a gate 290 made of polysilicon is formed, and then the top of the gate 290 is covered by the oxide film 280. Further, a collector electrode 205 is formed on a reverse side of the semiconductor substrate 210. Further, emitter electrodes 330 are formed to sandwich both sides of the oxide film 280 provided on the gate 290. Although being omitted from FIG. 6, the emitter electrodes 330 are obtained as a result of contact parts for electric conduction with the high-concentration n-type diffused layers 250 acting as emitters being formed in an interlayer dielectric film formed on a surface of the semiconductor layer 260.

In the above-described IGBT, as a result of a positive voltage being applied to the p layer 240 through the gate 290, an inversion layer (n channel) is formed in the p layer 240. Then, through the inversion layer, an electric current flows from the high-concentration n-type epitaxial layer 220 and the low-concentration n-type epitaxial layer 230 to the high-concentration n-type diffused layers 250. This electric current acts as a base current of a PNP transistor that includes the p-type semiconductor substrate 210, the high-concentration n-type epitaxial layer 220 and low-concentration n-type epitaxial layer 230, and the p layer 240. Thus, an operation of the PNP transistor is carried out in which a collector current flows from the p-type semiconductor substrate 210 to the p layer 240.

In this trench-type IGBT, it is possible to remarkably improve the density of the transistor cells in comparison to a common planar IGBT in which the gate 290 is formed on the surface of the semiconductor layer 260.

Further, as such a trench-type semiconductor device, other than the trench-type IGBT, a trench-type MOS (Metal Oxide Semiconductor) transistor is known and is used as a power MOS transistor.

It is noted that, although being different from the trench-type semiconductor device, such a semiconductor device is known (for example, see Japanese Laid-Open Patent Application No. 2007-207784 (referred to as Patent Document 1, hereinafter)) that in a semiconductor device having a super-junction structure, a thickness of a dielectric film provided on a control electrode in a device part is made equal to or less than one third of a thickness of a dielectric film provided in a terminal part adjacent to the device part.

However, in the above-described trench-type IGBT, an interval between the high-concentration n-type diffused layers 250 as the emitters is reduced in order to increase the density of transistor cells, and as a result, the aspect ratio of the contact parts of the emitter electrodes 330 increases. Thereby, voids may be easily generated above the contact parts in a case where a metal film is formed for the emitter electrodes 330. The aspect ratio means a ratio of the depth of the contact part with respect to the width of the contact part.

FIG. 7 shows in a magnified manner a sectional view of a trench-type IGBT in the related art. In FIG. 7, a trench 270 is formed in a semiconductor layer 260 that includes a low-concentration n-type epitaxial layer 230, a p layer 240 and high-concentration n layers 250 acting as emitters, a gate 290 of polysilicon is formed in the trench 270, and the gate 290 is covered by an oxide film 280. On the oxide film 280, a thermal CVD oxide film 300 and a BPSG dielectric film 310 are laminated, and form an interlayer dielectric film 320. A contact part 330 is formed in the interlayer dielectric film 320, and a metal layer 340 of aluminium is formed on the interlayer dielectric film 320 and is embedded in the contact portion 330.

In this structure, when the pitch of the trenches 270 is reduced, the diameter of the contact part 330 is reduced accordingly. As a result, the aspect ratio of the contact part 330 increases. Thereby, as shown in FIG. 7, a void 370 may be generated at a position of the contact part 330. The void 370 may cause the resistance of the contact part 330 to increase and/or adversely affect the electrode reliability. When the entirety of the interlayer dielectric film 320 is reduced in its thickness to become a thin film in order to solve the problem, then the withstand voltage that is ensured for a guard ring part other than the transistor cell part may be lowered.

Further, Patent Document 1 discloses a semiconductor device. In the semiconductor device, a thick interlayer dielectric film is formed on the entirety of a surface of a semiconductor device having the super-junction structure. After that, all of the interlayer dielectric film is removed for a portion in which the thickness of the interlayer dielectric film is to be reduced. After that, a thin film of a dielectric film is newly formed. However, in this configuration, since all the dielectric film having been formed first is removed from the portion of newly forming the thin film, the number of manufacturing processes increases, and the manufacturing processes may become complicated.

SUMMARY OF THE INVENTION

An object of an embodiment of the present invention is to provide a semiconductor device manufacturing method by which it is possible to increase a density of transistor cells without generating voids even through a simple manufacturing process.

In order to achieve the above-mentioned object, according to an embodiment of the present invention, a semiconductor device manufacturing method is a method of forming a semiconductor device that includes a cell part that includes plural transistor cells in each of which a gate of a trench type is formed in a semiconductor layer, and diffused layers are formed on both sides of the gate, and a guard ring part that surrounds the cell part. The semiconductor device manufacturing method includes forming an interlayer dielectric film on a surface of the semiconductor layer in which the gate and the diffused layers are formed; reducing a thickness of the interlayer dielectric film formed in the cell part through etch back; forming a contact part having a shape of a hole or a groove in the interlayer dielectric film at a position above the diffused layer; and forming a metal film on the interlayer dialectic film.

BRIEF DESCRIPTION OF THE DRAWINGS

Other objects and further features of the present invention will become more apparent from the following detailed description when read in conjunction with the following accompanying drawings:

FIGS. 1A and 1B show one example of the entire configuration of a semiconductor device according to an embodiment, FIG. 1A showing one example of a plan view of the entirety of the semiconductor device according to the embodiment and FIG. 1B showing one example of a sectional view of the semiconductor device according to the embodiment;

FIG. 1C shows one example of a sectional view of a semiconductor device according to a variant embodiment of the above-mentioned embodiment;

DETAILED DESCRIPTION OF THE EMBODIMENTS

Below, an embodiment of the present invention will be described with reference to figures.

Figure 1A:
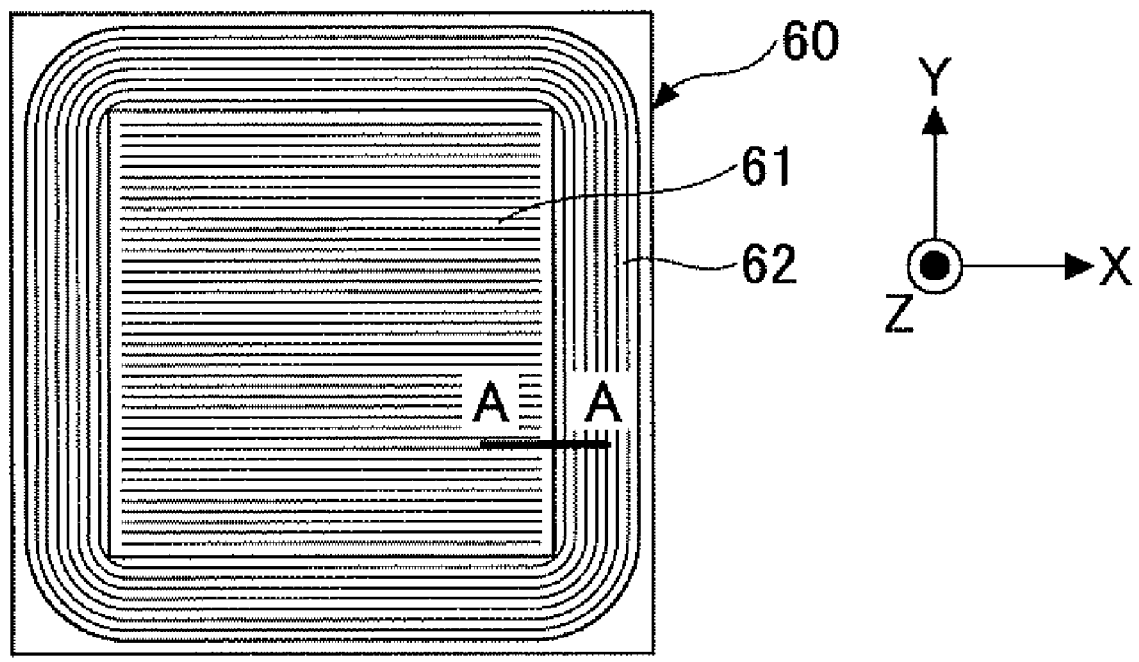

In FIG. 1A, a semiconductor device according to the embodiment includes a semiconductor layer 60 formed on a semiconductor substrate 10. The semiconductor layer 60 includes a cell part 61 and a guard ring part 62. The cell part 61 is an area in which plural transistor cells are formed. In the cell part 61, the plural transistor cells are formed, and all of the plural transistor cells form a single transistor. The guard ring part 62 is an area for electrically connecting the individual elements of the transistor cells included in the cell part 61 and connecting them with the outside, for causing the plural transistor cells to collectively operate as the single transistor. The guard ring part 62 is formed to surround the periphery of the cell part 61.

FIG. 1B shows a sectional view taken along a line A-A shown in FIG. 1A. A B-B line extending in a vertical direction in FIG. 1B represents a boundary between the cell part 61 and the guard ring part 62. The left side of the B-B line corresponds to the cell part 61 and the right side of the B-B line corresponds to the guard ring part 62.

In FIG. 1B, the semiconductor device according to the embodiment includes a reverse side electrode 5, the semiconductor substrate 10, a high-concentration n-type epitaxial layer 20, a low-concentration n-type epitaxial layer 30, p-type channel diffused layers 40, a p-type well layer 45, a high-concentration p-type diffused layer 46, high-concentration n-type diffused layers 50, trenches 70, a gate oxide film 80, a field oxide film 85, gates 90, a thermal CVD oxide film 100, a BPSG (Boron Phosphorous Silicate Glass) dielectric layer 110, a contact part 130, a metal layer 140 and a polyimide dielectric film 150. The semiconductor layer 60 includes the high-concentration n-type epitaxial layer 20, the low-concentration n-type epitaxial layer 30, the p-type channel diffused layers 40, the p-type well layer 45, the high-concentration p-type diffused layer 46 and the high-concentration n-type diffused layers 50. An interlayer dielectric film 120 includes the thermal CVD oxide film 100 and the BPSG dielectric film 110.

It is noted that in FIG. 1B, the semiconductor device is an IGBT, for example. However, the semiconductor according to an embodiment of the present invention may be a MOS transistor. For example, as shown in FIG. 1C, by providing an n-type semiconductor substrate 10' instead of the high-concentration n-type epitaxial layer 20, and forming the reverse side electrode 5 on the reverse side of the n-type semiconductor substrate 10', it is possible to obtain the n-channel MOS transistor. FIG. 1C shows one example of a variant embodiment of the embodiment shown in FIG. 1B.

The semiconductor substrate 10 is to be used for forming the semiconductor layer 60 on the surface of the substrate and forming the trench-type semiconductor device. In a case where the semiconductor device is the IGBT as shown in FIG. 1B, the semiconductor substrate 10 is made of a p-type semiconductor and functions as a collector. In a case where the semiconductor device is the n-channel MOS transistor as shown in FIG. 1C, the semiconductor substrate 10' is made of an n-type semiconductor and functions as a drain. As the material of the semiconductor substrate 10 or 10', various semiconductor materials may be used. For example, a silicon substrate may be used as the semiconductor substrate 10 or 10'.

It is noted that as shown in FIG. 1C, the semiconductor device according to the variant embodiment is approximately the same as the semiconductor device according to the embodiment shown in FIG. 1B. Therefore, for the semiconductor device according to the variant embodiment, the same reference numerals are given to the identical parts/components, and the duplicate description is omitted. In the semiconductor device according to the variant embodiment, as shown in FIG. 1C, since the high-concentration n-type epitaxial layer 20 is not included, a semiconductor layer 60' includes the low-concentration re-type epitaxial layer 30, the p-type channel diffused layers 40, the p-type well layer 45, the high-concentration p-type diffused layer 46 and the high-concentration n-type diffused layers 50.

The reverse side electrode 5 is a metal film formed as an electrode of the semiconductor device on the reverse side of the semiconductor substrate 10 or 10'. In the case where the semiconductor device is the IGBT, the reverse side electrode 5 acts as the collector electrode. In the case where the semiconductor device is the n-channel MOS transistor, the reverse side electrode 5 acts as the drain electrode.

The high-concentration n-type epitaxial layer 20 shown in FIG. 1B is formed through epitaxial growth on the surface of the semiconductor substrate 10, and is foamed to have relatively high impurity concentration.

The low-concentration n-type epitaxial layer 30 shown in FIG. 1B is an n-type epitaxial layer 30 having impurity concentration lower than that of the high-concentration n-type epitaxial layer 20, and is formed on the high-concentration n-type epitaxial layer 20.

The low-concentration n-type epitaxial layer 30 shown in FIG. 1C is formed through epitaxial growth on the surface of the semiconductor substrate 10'.

The p-type channel diffused layers 40 are p-type diffused layers acting as channels of the semiconductor device according to the embodiment or the variant embodiment. The p-type channel diffused layers 40 are p-type diffused layers of low concentration. The p-type channel diffused layers 40 may be formed only in the cell part 61.

The p-type well layer 45 is formed in the low-concentration n-type epitaxial layer 30. The p-type well layer 45 may be formed only in the guard ring part 62.

The high-concentration p-type diffused layer 46 acts as a connection part for connecting between the p-type well layer 45 and an electrode therefor, and is formed to have higher concentration and higher electrical conductivity than those of the p-type well layer 45.

The trench 70 is a groove formed for forming the gate 90 in the semiconductor layer 60 or 60'. As shown in FIG. 1B or 1C, the trench 70 is formed to have a length greater in a depth direction than a length in a width direction. Thereby, it is possible to form the gate 90 in the vertical direction, and thus, it is possible to obtain the single transistor cell having a reduced area in the plan view. For example, the trench 70 may be formed to have a depth on the order of 3 through 5 μm.

The gate oxide film 80 covers the gates 90, and, for example, may be made of $SiO_2$ or such.

The field oxide film 85 is a dielectric film used for device isolation. The field oxide film 85 may be made of, for example, LOCOS (Local Oxidation of Silicon).

The gate 90 is an electrode for inputting a signal and functioning as a control electrode of the semiconductor device. The gate 90 is made of, for example, a polysilicon film having electrical conductivity. It is noted that the top of the gate 90 is covered by the gate oxide film 80.

The thermal CVD oxide film 100 is a kind of a dielectric film to be used in the interlayer dielectric film 120. Similarly, also the BPSG dielectric film 110 is a kind of a dielectric film to be used in the interlayer dielectric film 120. The BPSG dielectric film 110 is a dielectric film in which boron (B) and phosphorus (P) are contained in $SiO_2$. The interlayer dielectric film 120 is a laminated film including the thermal CVD oxide film 100 and the BPSG dielectric film 110. It is noted that as the interlayer dielectric film 120, various dielectric films may be used as long as it provides suitable insulating performance. For example, the interlayer dielectric film 120 may include only one of the thermal CVD oxide film 100 and the BPSG dielectric film 110, or may be made of other insulating material.

Figure 1D:
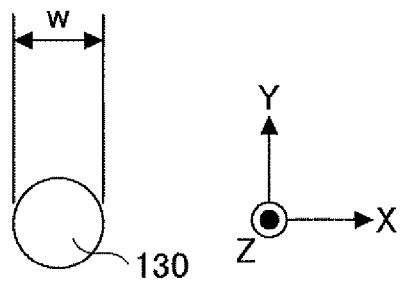
FIGS. 1D and 1E show examples of plan views of contact parts in the semiconductor device according to the embodiment or the variant embodiment.
Figure 1E:
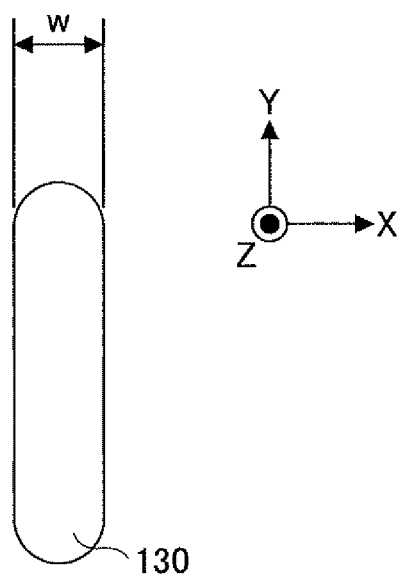

The contact part 130 acts as an interconnection path for electrically connecting between the high-concentration n-type diffused layer 50 acting as an emitter or source according to the embodiment or the variant embodiment and an external interconnection. The contact part 130 is provided as a result of a hole or a groove, as shown in FIG. 1D or 1E, each of which passes through the interlayer dielectric film 120 having been formed. FIGS. 1D and 1E show plan views of different examples of the contact part 130. FIG. 1D shows an example of the contact part 130 having a form of a hole passing through the interlayer dielectric film 120. FIG. 1E shows another example of the contact part 130 having a form of a groove passing through the interlayer dielectric film 120. It is noted that the contact part 130 may be formed not only in the cell part 61 but also in all the places in which electrical conduction with external interconnections is necessary in the guard ring part 62.

The metal film 140 acts as interconnection material for electrically connecting, through the contact part 130 or another contact part, with the diffused layer 50, 45 or 46, or the gates 90 formed in the semiconductor layer 60.

The polyimide dielectric film 150 is for insulating the metal film 140, and is formed on the surface of the metal film 140.

Figure 7:
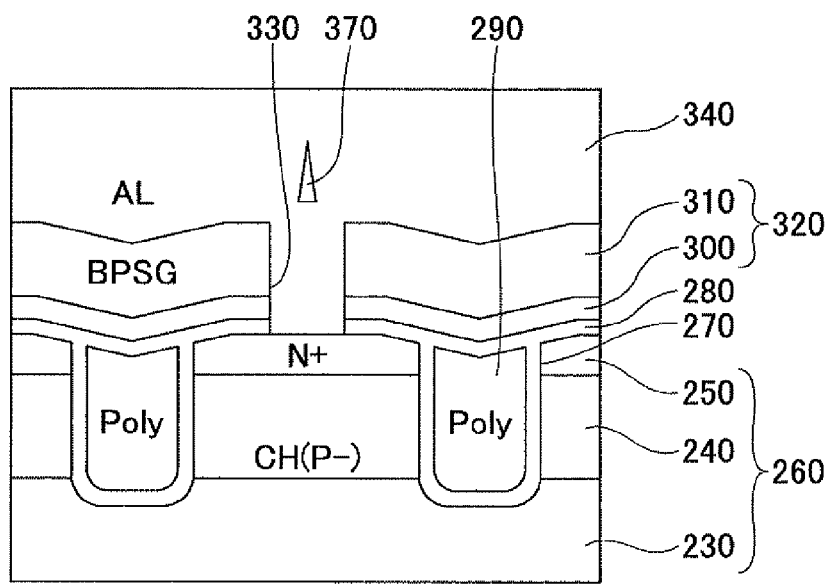
FIG. 7 shows, in a magnified manner, a sectional view of a trench-type IGBT according to the related art.

It is noted that at the boundary B-B line between the cell part 61 and the guard ring part 62, the thickness of the interlayer dielectric film 120 is smaller in the cell part 61 and is on the order of approximately ½ of the thickness of the interlayer dielectric film 120 in the guard ring part 62. The reason therefor will be described below. That is, the contact part 130 is formed in the interlayer dielectric film 120 above the high-concentration n-type diffused layer 50 in the cell part 61. If the metal film 140 is embedded in the contact part 130 in such a condition that the interlayer dielectric film 120 were thicker in the guard ring part 62, there would be an increased likelihood that the void 370 would be generated as described above with reference to FIG. 7. This is because if the interlayer dielectric film 120 were thick, in a case where the interconnection pitch is short and the space in which the contact part 130 is formed is small, the aspect ratio of the contact part 130 would become large, and thus, the contact part 130 would have a shape of a deep hole or a deep groove.

On the other hand, for the guard ring part 62, since electric currents that flow through the cell part 61 are gathered, there would be a likelihood that the guard ring part 62 would not withstand in such a situation where a high voltage is applied, if the interlayer dielectric film 120 were reduced in its thickness in the guard ring part 62.

Therefore, in the semiconductor device according to the embodiment or the variant embodiment, only the part of the interlayer dielectric film 120 existing in the cell part 61 is reduced in its thickness, and the other part of the interlayer dielectric film 120 existing in the guard ring part 62 is maintained as having large film thickness. Thereby, it is possible to avoid generation of voids as a result of the film thickness of the interlayer dielectric film 120 being reduced in the cell part 61 where the interconnection pitch is short; such voids would be easily generated but for an electric current that flows through or a voltage applied to the single cell being small or low. Further, in the guard ring part 62 where a large electric current flows or a high voltage is applied, the interlayer dielectric film 120 is made thicker and thus the withstand voltage is increased. Thus, it is possible to cope with the high density of the transistor cells in the cell part 61 and have improvement in the reliability.

It is noted that the whole process of manufacturing the semiconductor device according to an embodiment is carried out as follows: First, the high-concentration n-type epitaxial layer 20 and the low-concentration n-type epitaxial layer 30 are or the low-concentration n-type epitaxial layer 30 is formed on the semiconductor substrate 10 or 10'. Next, the p-type well 45 is formed, and the field oxide film 85 is formed on the surface of the semiconductor layer 60. Next, the p-type channel diffused layer 40 is formed, and the trenches 70 are formed from the surface of the p-type channel diffused layer 40. After the gate oxide film 80 is formed on the surfaces of the trenches 70, embedding of the polysilicon film is started and the gates 90 are formed. Next, the high-concentration n-type diffused layer 50 is formed, and the high-concentration p-type diffused layer 46 is formed. Next, the interlayer dielectric film 120 is formed. From the process by which the interlayer dielectric film 120 is formed, description will now be made in more detail with reference to FIGS. 2, 3A, 3B, 3C, 3D and 4.

Figure 2:
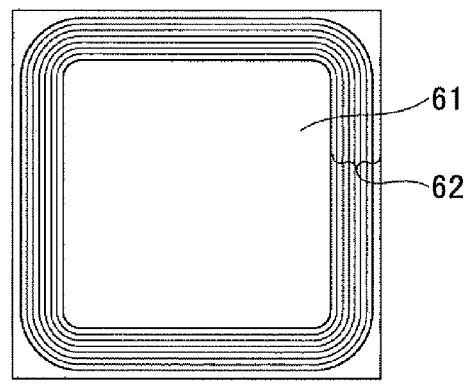
FIG. 2 shows, in a simplified manner, an example of a plan view of the entirety of the semiconductor device according to the embodiment.

FIG. 2 shows, in a simplified manner, a plan view of the semiconductor device according to the embodiment or the variant embodiment. In FIG. 2, the cell part 61 exists in the center and the guard ring part 62 is formed around to surround the cell part 61. Because processing carried out on the cell part 61 is a core part of the semiconductor device manufacturing method according to an embodiment, description will be made with a focus on the processing carried out on the cell part 61.

FIGS. 3A, 3B, 3C and 3D show processes carried out on the cell part 61 in the semiconductor device manufacturing method according to the embodiment. It is noted that for the parts/components described above with reference to FIGS. 1A, 1B, 1C, 1D and 1E and 2, the same reference numerals are given and duplicate description will be omitted.

Figure 3A:
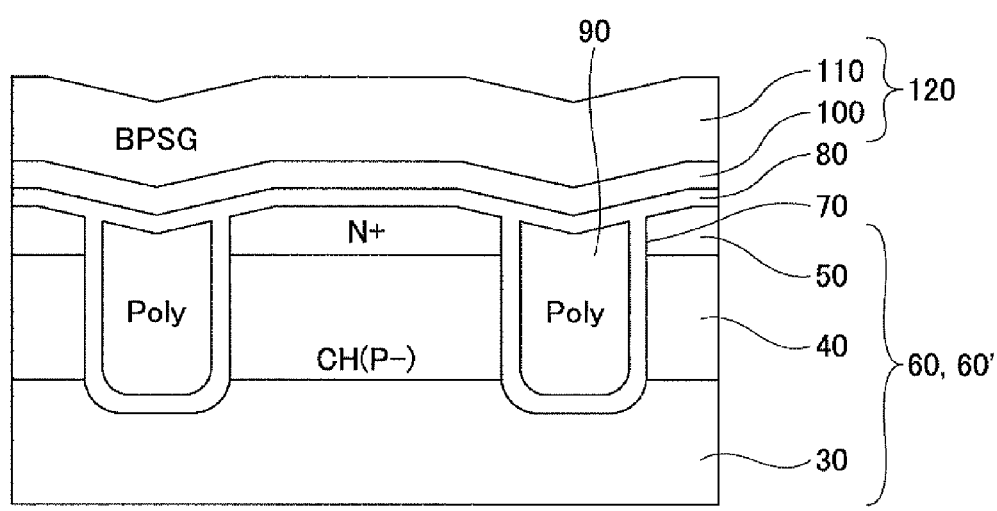
FIGS. 3A, 3B, 3C and 3D show one example of a manufacturing method of manufacturing the semiconductor device according to an embodiment of the present invention, FIG. 3A showing one example of an interlayer dielectric film forming process, FIG. 3B showing one example of an etch back process, FIG. 3C showing one example of a contact part forming process and FIG. 3D showing one example of metal film forming process.

FIG. 3A shows one example of a process of forming the interlayer dielectric film 120. In the process of forming the interlayer dielectric film 120, the interlayer dielectric film 120 is formed on the surface of the semiconductor layer 60 or 60'. As a specific method of forming the interlayer dielectric film 120, various methods of forming a film may be used. For example, the interlayer dielectric film 120 may be formed through CVD (Chemical Vapor Deposition), another deposition method or such. Further, as shown in FIG. 3A, in a case where the interlayer dielectric film 120 includes the two layers, i.e., the thermal CVD oxide film 100 and the BPSG dielectric film 110, a process of forming a film may be carried out for each of the respective materials, and thus, the multi-layer interlayer dielectric film 120 is formed. It is noted that the thickness of the interlayer dielectric film 120 may be various thicknesses depending on particular uses. For example, the interlayer dielectric film 120 may have a thickness of 600 through 800 nm.

Figure 3B:
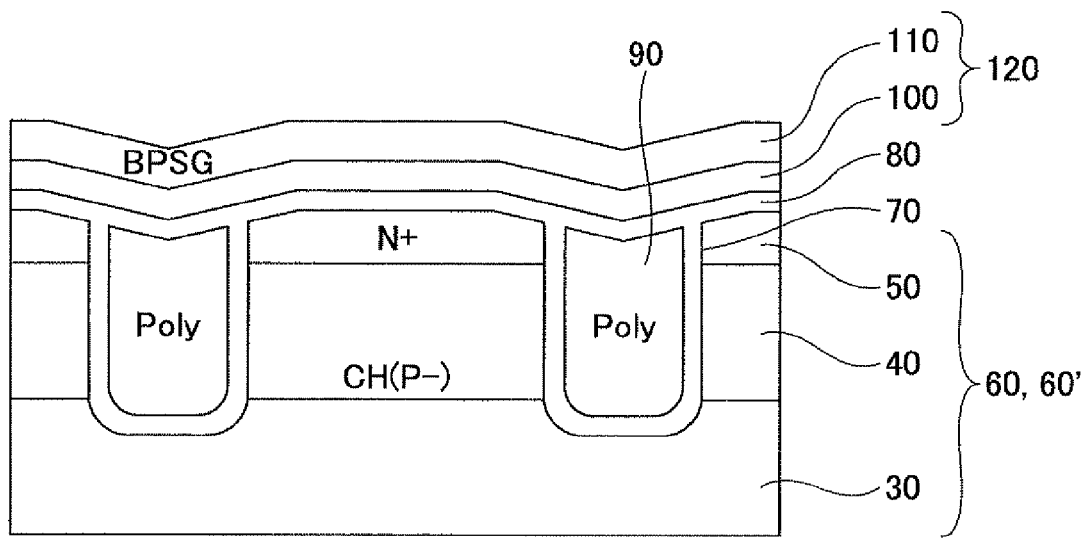

FIG. 3B shows one example of a process of etch back. In the process of etch back, etch back is carried out on the interlayer dielectric film 120 in the cell part 61, and thus, the film thickness of the interlayer dielectric film 120 existing within the cell part 61 is reduced. In the process of etch back, the entirety of the interlayer dielectric film 120 is etched back within the cell part 61. However, in the example of FIG. 3B, specifically, the BPSG dielectric film 110 that is formed as the highest layer in the interlayer dielectric film 120 is reduced in its thickness. As a specific method of the process of etch back, various etching methods may be used. For example, etching may be carried out by using a mask having an opening only for the cell part 61.

Figure 4:
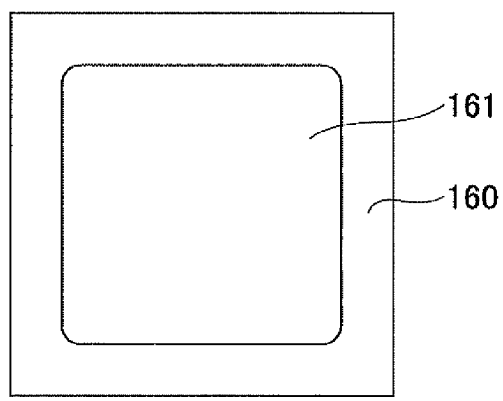
FIG. 4 shows one example of a mask 160 used in the etch back process.

FIG. 4 shows one example of a mask 160 to be used for the etch back. By carrying out etching by using the mask 160 having an opening 161 formed to correspond to the cell part 61 as shown in FIG. 4, it is possible to reduce the film thickness of the interlayer dielectric film 120 only for the cell part 61. It is noted that the mask 160 may be formed as a result of a resist layer being formed on the interlayer dielectric film 120 first, and then, the mask 160 having the resist pattern shown in FIG. 4 being formed. In this case, the process of forming the mask 160 shown in FIG. 4 may be referred to as a resist patterning process.

Further, etching in the etch back process may be, for example, dry etching. Thereby, it is possible to carry out the etching process while controlling the thickness of the interlayer dielectric film 120 with high accuracy.

Returning to FIG. 3B, the thickness of the interlayer dielectric film 120 reduced through the etch back within the cell part 61 may be set to be various values depending on particular uses. For example, in a case where the thickness of the interlayer dielectric film 120 before the etch back is 600 through 800 nm, the thickness after the etch back may be 300 through 400 nm. By reducing the thickness of the interlayer dielectric film 120 to the thickness on the order of ½ of the original thickness within the cell part 61, it is possible to considerably reduce generation of voids. It is noted that the thickness of the interlayer dielectric film 120 within the cell part 61 may be set such that with respect to the width "w" (see FIGS. 1B, 1C, 1D and 1E) of the contact part 130 formed in the interlayer dielectric film 120, the contact part 130 having the aspect ratio such that no void will be generated is formed. This point will be described later in detail with reference to FIG. 5.

Figure 3C:
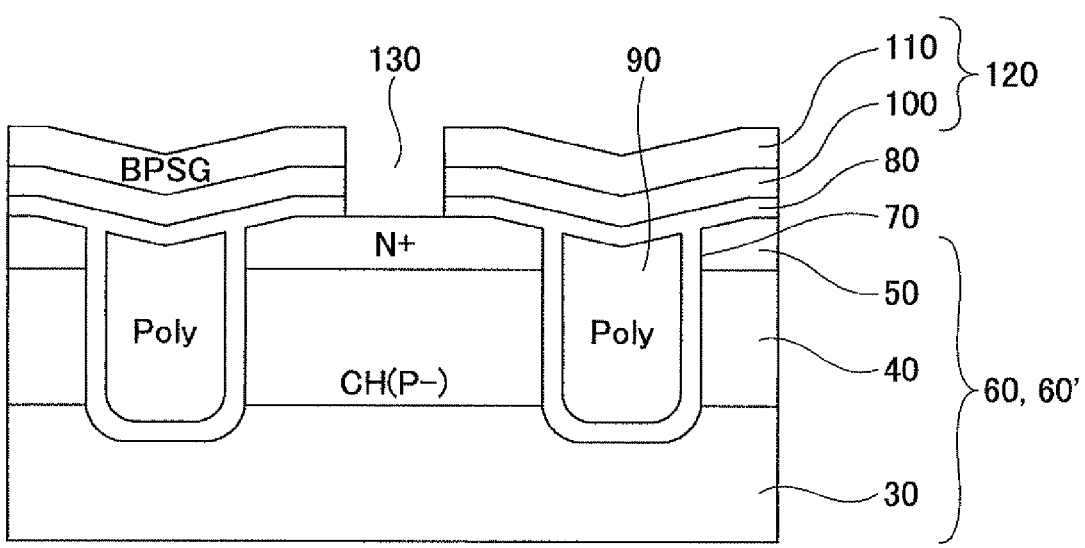

FIG. 3C shows one example of a process of forming the contact part 130. In the process of forming the contact part 130, the interlayer dielectric film 120 is removed at a position of forming the contact part 130 through etching. It is noted that a specific method of the etching may be various methods. In order to form the contact part 130 with higher accuracy, dry etching may be used.

Also in this case, a mask made of resist or such may be used to cover an area of the cell part 61 other than a position at which the contact part 130 is formed. Then, the part of the interlayer dielectric film 120, which part is not covered by the mask, may be removed and thus, the contact part 130 may be formed.

Since the thickness of the interlayer dielectric film 120 has been reduced through the process of etch back described above with reference to FIG. 3B, the contact part 130 having the small aspect ratio is obtained. It is noted that the contact part 130 is formed at a position above the high-concentration n-type diffused layer 50 that will act as the emitter or the source.

Figure 3D:
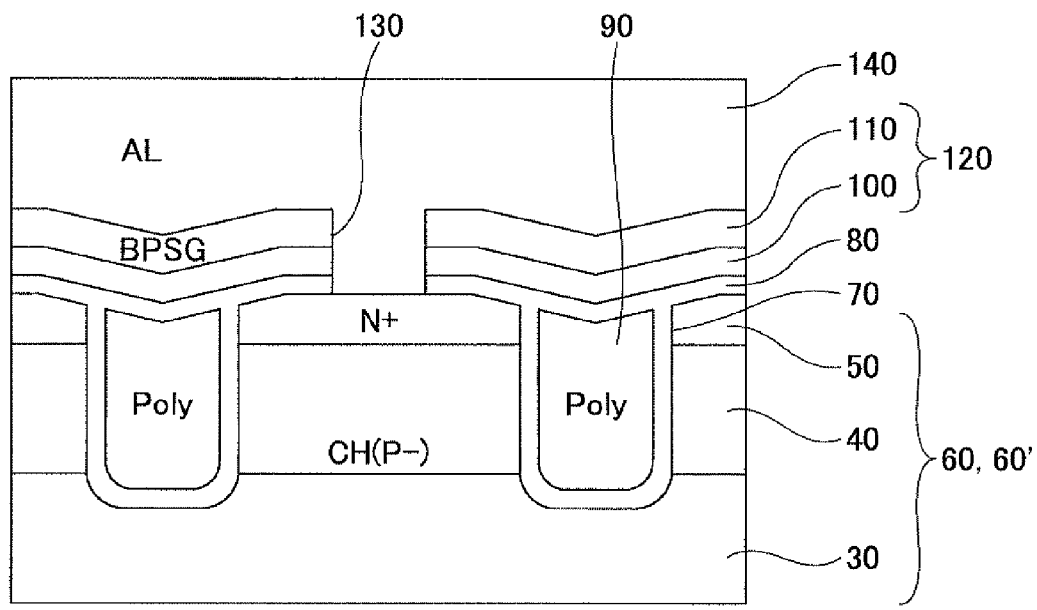

FIG. 3D shows one example of a process of forming the metal film 140. In the process of forming the metal film 140, the metal film 140 is formed on the interlayer dielectric film 120. The metal film 140 may be formed on the surface of the entire area in which the semiconductor device is formed, the entire area including not only the cell part 61 but also the guard ring part 62. As described above with reference to FIG. 3C, the aspect ratio of the contact part 130 is small. Therefore, no void is generated near the contact part 130, and thus, it is possible to form the metal film 140 in a satisfactory condition. Since no void is generated, an increase in electrical resistance does not occur, the metal film 140 can be formed uniformly, and thus, it is possible to achieve stable electric characteristics.

It is noted that a specific method of forming the metal film 140 may be various methods. For example, the metal film 140 may be formed through electroplating.

Further, various metal materials may be used as the metal film 140. For example, aluminium may be used as the material of the metal film 140. Other than this example, it is also possible to use copper as the material of the metal film 140 when diffusion is controlled by forming a barrier layer or such.

It is noted that after that, the polyimide film 150 is formed on the metal film 140, and the reverse side electrode 5 is formed on the reverse side of the semiconductor substrate 10 or 10'. Thus, the semiconductor device according to the embodiment or the variant embodiment is completed.

Figure 5:
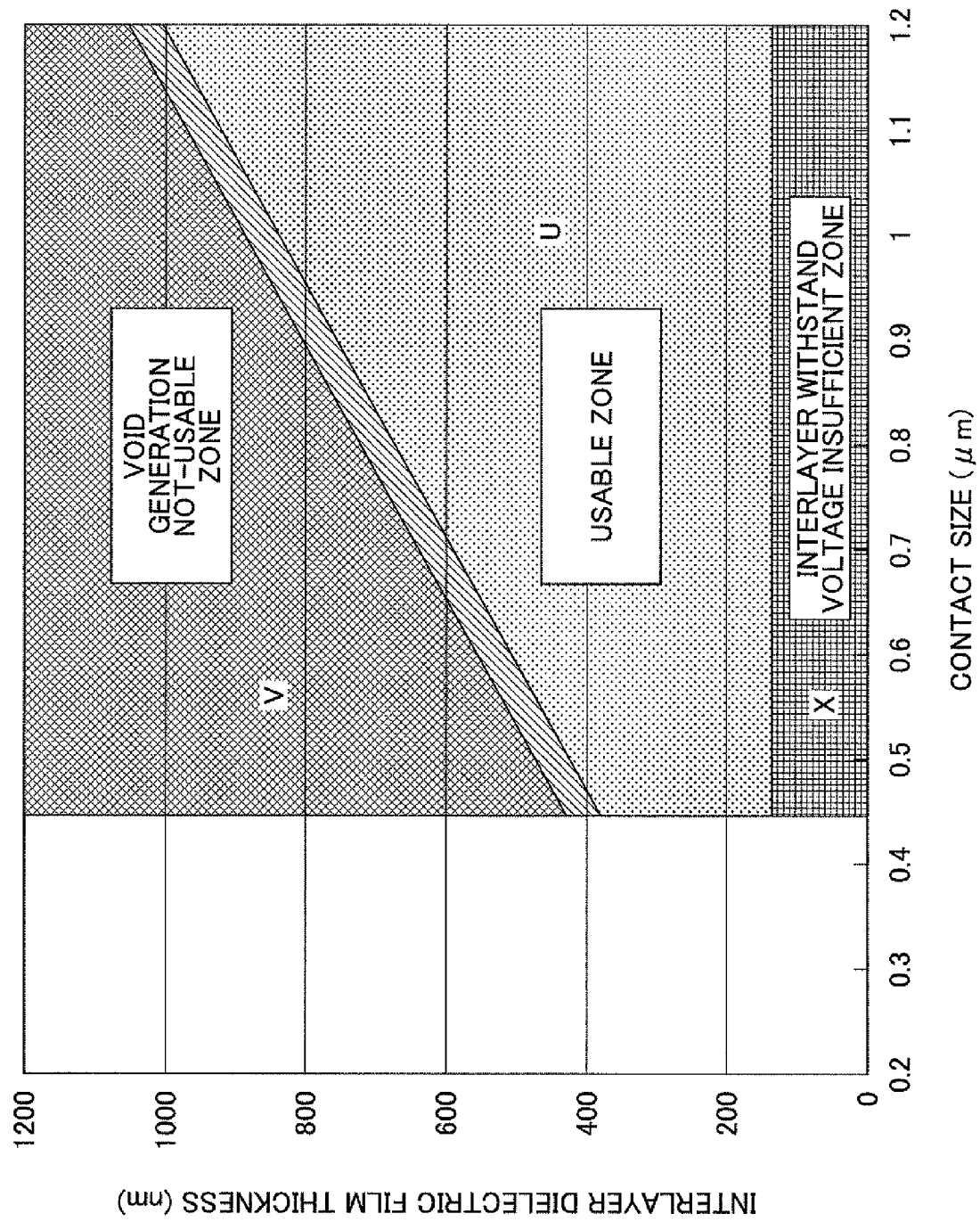
FIG. 5 shows one example of a relationship between a size of the contact part and a thickness of an interlayer dielectric film in the semiconductor device according to the embodiment or the variant embodiment.
Figure 6:
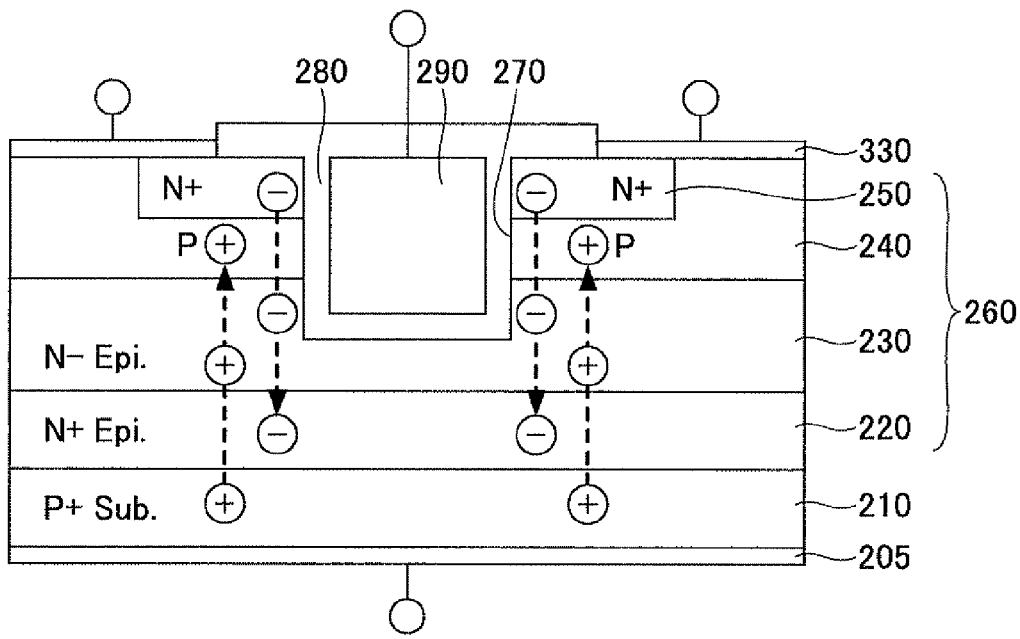
FIG. 6 shows a sectional view of a trench-type IGBT according to the related art.

FIG. 5 shows one example of relationship between the size (i.e., width "w", see FIGS. 1B, 1C, 1D and 1E) of the contact part 130 and the thickness of the interlayer dielectric film 120. In FIG. 5, the axis of abscissa represents the size of the contact part 130 [μm] ("CONTACT SIZE" in FIG. 5) and the axis of ordinate represents the thickness of the interlayer dielectric film 120 [nm] ("INTERLAYER DIELECTRIC FILM THICKNESS" in FIG. 5).

In FIG. 5, a zone V represents a zone that is not possible to actually use for the semiconductor device because voids may be generated. A zone U represents a zone that is possible to actually use for the semiconductor device because few voids are generated. A zone X represents a zone that cannot be actually used for the semiconductor device because the withstand voltage of the interlayer dielectric film 120 is so low.

As shown in FIG. 5, the upper limit of the zone U increases in proportion to the size of the contact part 130. Therefrom, it is seen that as the density of the transistor cells is increased and the size of the contact part 130 is to be reduced accordingly, it is necessary to reduce the thickness of the interlayer dielectric film 120 accordingly. Since the size of the contact part 130 is larger than the thickness of the interlayer dielectric film 120 on the upper limit of the zone U, it is seen that the aspect ratio of the contact part 130 is required to be less than 1. Therefore, it is necessary to form the interlayer dielectric film 120 to have the film thickness smaller than the width of the contact part 130.

Further, focusing on the lower limit of the zone U, it is seen that, regardless of the size of the contact part 130, it is necessary to make the thickness of the interlayer dielectric film 120 be equal to or more than a fixed value. The specific numeric value of the fixed value varies depending on the conditions of the device, the actually used material, and so forth. It is seen that, in FIG. 5, the thickness of the interlayer dielectric film 120 is required to have the thickness equal to or more than approximately 120 nm.

Thus, it is seen that it is preferable to make the film thickness of the interlayer dielectric film 120 in the cell part 61 obtained from the etch back process be smaller than the width "w" of the contact part 130, and also, larger than the thickness with which the predetermined withstand voltage of the interlayer dielectric film 120 is ensured.

However, the example shown in FIG. 5 is merely one example, and the film thickness of the interlayer dielectric film 120 may be set in various values with which the interlayer dielectric film 120 has the withstand voltage equal to or more than the required withstand voltage, and also, generation of voids is controlled.

The present invention may be applied to a semiconductor device such as IGBT, a MOS transistor, and so forth.

According to an embodiment of the present invention, a semiconductor device manufacturing method is a method of forming a semiconductor device that includes a cell part (61) that includes plural transistor cells in each of which a gate (90) of a trench type is formed in a semiconductor layer (60), and diffused layers (50) are formed on both sides of the gate (90), and a guard ring part (62) that surrounds the cell part (61). The semiconductor device manufacturing method includes forming an interlayer dielectric film (120) on a surface of the semiconductor layer (60) in which the gate (90) and the diffused layers (50) are formed; reducing a thickness of the interlayer dielectric film (120) formed in the cell part (61) through etch back; forming a contact part (130) having a shape of a hole or a groove in the interlayer dielectric film (120) at a position above the diffused layer (50); and forming a metal film (140) on the interlayer dialectic film (120).

By this configuration, since the thickness of the interlayer dielectric film (120) is thus reduced, the aspect ratio of the contact part (130) can be reduced, and thus, it is possible to control generation of voids when the metal film is formed.

According to another embodiment of the present invention, in the etch back, the thickness of the interlayer dielectric film (120) is reduced to within a range such that the thickness of the interlayer dielectric film (120) is smaller than the diameter (w) or the width (w) of the groove of the contact part (130), and also, the withstand voltage of the interlayer dielectric film (120) is equal to or more than the required withstand voltage.

Thereby, it is possible to reduce generation of voids by reducing the thickness of the interlayer dielectric film (120), and ensure the necessary withstand voltage of the interlayer dielectric film (120). Thus, it is possible to improve the electrical reliability.

According to yet another embodiment of the present invention, in the etch back, a mask (160) is used which covers the guard ring part (62) and has an opening (161) for the cell part (61).

Thus, it is possible to reduce the thickness of the interlayer dielectric film (120) only for the cell part (61). Thereby, it is possible to maintain the withstand voltage of the interlayer dielectric film (120) necessary for the guard ring part (62), and also, reduce generation of voids. Thus, it is possible to improve the electrical reliability.

According to still another embodiment of the present invention, the cell part (61) is formed as an IGBT, and the diffused part (50) acts as an emitter of the IGBT.

In this configuration, interconnection for the emitter electrode does not include voids, and thus, it is possible to manufacture a trench-type IGBT having high electrical stability.

According to another embodiment of the present invention, the cell part (61) is formed as a MOS transistor, and the diffused part (50) acts as a source of the MOS transistor.

In this configuration, interconnection for the source electrode does not include voids, and thus, it is possible to manufacture a trench-type MOS transistor having high electrical stability. Such a MOS transistor may be suitably used as a power MOS transistor.

Thus, according to the embodiments of the present invention, it is possible to reduce generation of voids in the electrode and manufacture the trench-type semiconductor device having high electrical stability.

Further, the present invention is not limited to the above-described embodiments, and variations and modifications may be made without departing from the basic concept of the present invention.

The present application is based on Japanese Priority Application No. 2010-076646, filed Mar. 30, 2010, the entire contents of which are hereby incorporated herein by reference.

What is claimed is:

1. A semiconductor device manufacturing method of forming a semiconductor device that includes a cell part that includes plural transistor cells in each of which a gate of a trench type is formed in a semiconductor layer and diffused layers are formed on both sides of the gate, and a guard ring part that surrounds the cell part, the semiconductor device manufacturing method comprising:

forming an interlayer dielectric film on a surface of the semiconductor layer in which the gate and the diffused layers are formed;

reducing a thickness of the interlayer dielectric film formed in the cell part through an etch back process;

forming a contact part having a shape of a hole or a groove in the interlayer dielectric film at a position above the diffused layer; and forming a metal film on the interlayer dielectric film, wherein in the etch back process, a mask is used which covers the guard ring part and has an opening for the cell part.

2. The semiconductor device manufacturing method as claimed in claim 1, wherein in the etch back process, the thickness of the interlayer dielectric film is reduced such that the thickness of the interlayer dielectric film is smaller than the diameter or the width of the groove of the contact part, and, a withstand voltage of the interlayer dielectric film is equal to or more than a required withstand voltage.

3. The semiconductor device manufacturing method as claimed in claim 1, wherein the cell part is formed as an IGBT, and the diffused part acts as an emitter of the IGBT.

4. The semiconductor device manufacturing method as claimed in claim 1, wherein the cell part is formed as a MOS transistor, and the diffused part acts as a source of the MOS transistor.

5. A semiconductor device manufacturing method of forming a semiconductor device that includes a cell part that includes plural transistor cells in each of which a gate of a trench type is formed in a semiconductor layer and diffused layers are formed on both sides of the gate, and a guard ring part that surrounds the cell part, the semiconductor device manufacturing method comprising:

forming an interlayer dielectric film on a surface of the semiconductor layer in which the gate and the diffused layers are formed;

reducing a thickness of the interlayer dielectric film formed in the cell part through an etch back process;

forming a contact part having a shape of a hole or a groove in the interlayer dielectric film at a position above the diffused layer;

forming a metal film on the interlayer dielectric film; and electrically connecting the plural transistor cells to each other through the metal film and further connecting the connected plural transistor cells to the guard ring part so that the plural transistor cells function as one transistor.

6. The semiconductor device manufacturing method as claimed in claim 5, wherein in the etch back process, the thickness of the interlayer dielectric film is reduced such that the thickness of the interlayer dielectric film is smaller than the diameter or the width of the groove of the contact part, and a withstand voltage of the interlayer dielectric film is equal to or more than a required withstand voltage.

7. The semiconductor device manufacturing method as claimed in claim 5, wherein in the etch back process, a mask is used which covers the guard ring part and has an opening for the cell part.

8. The semiconductor device manufacturing method as claimed in claim 5, wherein the cell part is formed as an IGBT, and the diffused part acts as an emitter of the IGBT.

9. The semiconductor device manufacturing method as claimed in claim 5, wherein the cell part is formed as a MOS transistor, and the diffused part acts as a source of the MOS transistor.

* * * * *